US009146696B2

(12) United States Patent
Wang et al.

(10) Patent No.: US 9,146,696 B2
(45) Date of Patent: Sep. 29, 2015

(54) MULTI-GRANULARITY PARALLEL STORAGE SYSTEM AND STORAGE

(75) Inventors: Donglin Wang, Beijing (CN); Shaolin Xie, Beijing (CN); Xiaojun Xue, Beijing (CN); Zijun Liu, Beijing (CN); Zhiwei Zhang, Beijing (CN)

(73) Assignee: Institute of Automation, Chinese Academy of Sciences, Beijing (CN)

( * ) Notice: Subject to any disclaimer, the term of this patent is extended or adjusted under 35 U.S.C. 154(b) by 107 days.

(21) Appl. No.: 14/117,792

(22) PCT Filed: Dec. 31, 2011

(86) PCT No.: PCT/CN2011/085144
§ 371 (c)(1),
(2), (4) Date: Nov. 14, 2013

(87) PCT Pub. No.: WO2013/097223
PCT Pub. Date: Jul. 4, 2013

(65) Prior Publication Data
US 2014/0082282 A1    Mar. 20, 2014

(51) Int. Cl.
*G06F 12/00*    (2006.01)
*G06F 3/06*    (2006.01)
*G06F 12/02*    (2006.01)
*G11C 7/10*    (2006.01)
*G11C 8/10*    (2006.01)
*G11C 8/12*    (2006.01)

(52) U.S. Cl.
CPC .............. *G06F 3/0689* (2013.01); *G06F 3/061* (2013.01); *G06F 3/064* (2013.01); *G06F 12/023* (2013.01); *G06F 12/0207* (2013.01); *G06F 12/0223* (2013.01); *G11C 7/1006* (2013.01); *G11C 8/10* (2013.01); *G11C 8/12* (2013.01)

(58) Field of Classification Search
CPC   G06F 12/0207; G06F 12/0223; G06F 12/023
See application file for complete search history.

(56) References Cited

U.S. PATENT DOCUMENTS

| 6,804,771 | B1 | 10/2004 | Jung et al. |
| 7,082,049 | B2 | 7/2006 | Freebern |
| 2007/0208968 | A1 | 9/2007 | Krishnamurthy et al. |

FOREIGN PATENT DOCUMENTS

| CN | 101395675 A | 3/2009 |
| CN | 101609715 B | 9/2012 |

OTHER PUBLICATIONS

International Search Report issued in PCT/CN2011/085144 mailed on Nov. 1, 2012 (6 pages).
Written Opinion of the International Searching Authority issued in PCT/CN2011/085144 mailed on Nov. 1, 2012 (4 pages).
Ke, W. et al.; "A Model of High-Speed Parallel Accessing Memory"; Computer Applications and Software, vol. 25, No. 11, Nov. 2008, pp. 51-52, 55 (4 pages).

*Primary Examiner* — Shawn X Gu
(74) *Attorney, Agent, or Firm* — Osha Liang LLP

(57) ABSTRACT

A multi-granularity parallel storage system includes an R/W port and a memory. The memory includes W memory blocks and a data gating network. Each of the memory blocks is a 2D array consisting of multiple memory units, and each memory row of the 2D array includes W memory units. For each memory block, one memory row can be read/written at a time, W is the nth power of 2, and n is a natural number.

10 Claims, 10 Drawing Sheets

Read Matrix Column, R/W Granularity g=2

MULTI-GRANULARITY PARALLEL STORAGE SYSTEM AND STORAGE

CROSS-REFERENCE TO RELATED APPLICATIONS

This is a national stage application based on PCT/CN2011/085144, filed on Dec. 31, 2011. This application claims the priority from the same, and hereby incorporates the same by reference in its entirety.

TECHNICAL FIELD

The present application relates to storage technology, and primarily to on-chip storage systems in embedded signal processing platforms, especially multi-granularity parallel storage systems and memories that support multi-granularity parallel read/write (R/W) in rows and columns.

BACKGROUND

With advance of Integrated Circuit (IC) processes, more computing components and larger-capacity Static Random Access Memory (SRAM) can be integrated on a chip. A high-speed embedded signal processing chip can be designed and provided with multiple computing components and multiple on-chip memories of large capacity and bit width to enable parallel computation and storage. Signal processing algorithms generally organize input/output data in a matrix, and use the matrix as an object for computation. Matrix data are generally stored in rows or columns in a memory. The R/W ports of a memory are fixed in bit width, and sequentially addressed. When a matrix is stored in rows, the memory can read/write in parallel multiple elements in a row of the matrix at a time, but cannot read/write in parallel multiple elements in a column of the matrix at a time. When a matrix is stored in columns, the memory can read/write in parallel multiple elements in a column of the matrix at a time, but cannot read/write in parallel multiple elements in a row of the matrix at a time.

FIG. 1 is a schematic diagram of a structure of a conventional on-chip memory and an addressing scheme thereof, showing the locations of elements in a matrix on the conventional on-chip memory when the data type of the matrix is consistent with memory unit. As shown in FIG. 1, assuming that the memory R/W port 110 has a bit width of 4, i.e., 4 elements are stored in one row of the memory 100, and 4 elements having consecutive addresses can be read/written in parallel at one operation. The matrix A is of a size 4×4, and an element at the ith row and jth column of the matrix is denoted as $a_{ij}$ (0≤i<4, 0≤j<4). The matrix A is stored by rows at an address 0. In this case, the memory 100 can read/write in parallel 4 elements in a row of the matrix at a time. As the elements in a column of the matrix are distributed in multiple rows 104 of the memory, only one element in a column can be read/written per time. It is impossible to conduct parallel read/write of elements in a column.

In the signal processing system, parallel read/write of matrix elements in a column is often required while parallel read/write of matrix elements is performed in a row. For example, some signal processing algorithm takes three matrices (A,B,D) as input, and expects to obtain two matrix multiplication results C=A×B, E=B×D. Meanwhile, there are 4 computation units capable of parallel computation in the signal processing system. When C=A×B is calculated, it is necessary to read/write in parallel 4 elements in a column of the matrix B; when E=B×D is calculated, it is necessary to read/write in parallel 4 elements in a row of the matrix is B. According, in addition to parallel read/write of the matrix B by row, parallel read/write of the matrix B by column is also required throughout the processing of the algorithm. Unfortunately, the conventionally-structured memory is only capable of parallel read/write either by row or by column. When the memory fails to provide concurrently the required 4 operands in each clock cycle, only one of the 4 operational units can be in an active state, and this inevitably degrades the operational efficiency of the overall system.

There are various data types for matrices. Common data types include byte of 8 bits, short word of 16 bits, integer and single-precision floating-point of 32 bits, and double-precision floating-point of 64 bits. The memory units have one fixed data type, and each address corresponds to an 8bit data or a 32bit data. In order to express all the data types with the most basic memory unit in the memory, a common approach is to concatenate multiple consecutive low-bit-width data types into a high-bit-width data type. As shown in FIG. 2, assuming that the memory unit is a byte of 8 bits, the matrix has a size of 4×2, and a data type of 16 bit short word. The matrix elements are arranged in rows, and one matrix element is formed by concatenating two consecutive bytes of 8 bits. In FIG. 1, the data type of the matrix is matched with the memory unit. The addresses of the column elements of the matrix are {3, 7, 11, 15}, that is, the addresses of the columns are discrete. In FIG. 2, however, the data type of the matrix is not matched with the memory unit. The addresses of the column elements of the matrix are {2, 3, 6, 7, 10, 11, 14, 15}, that is, the addresses of the columns as a whole are discrete, but part of the addresses are consecutive. Therefore, during parallel read/write of matrix row and column elements, it is necessary to take different data types of the matrix elements into account, and accordingly to use different read/write granularities. Here, "read/write granularity" refers to the number of memory units at consecutive addresses.

Some patent documents have discussed how to perform read/write operations on matrix rows/columns, but not yet fulfill the function of multi-granularity parallel read/write of matrix row/columns at the level of SRAM architecture. The patent documents, such as U.S. Pat. No. 6,804,771B ("Processor With Register File Accessible By Row Column to Achieve Data Array Transposition"), and CN Patent 200910043343.5 ("Matrix Register File with Separate Row and Column Access Ports"), have provided a register file that supports read/write of matrix rows/columns. However, the matrix data are still stored in the memory, and it is necessary to initially load the matrix data from the memory to the register file, and then read/write matrix row/columns in the register file. Meanwhile, the register file has a very small capacity, and thus only a small part of the matrix data can be read/written at each operation. Further, these patent documents do not consider how to support different data types. U.S. Pat. No. 7,082,049B2 ("Random Access Memory Have Fast Column Access") primarily discusses how to rapidly acquire consecutive data from the memory rows of DRAM, but does not discuss parallel read/write of matrix rows/columns.

SUMMARY

Technical Problem to be Solved

The present disclosure is made to address the problems with the conventional on-chip storage systems that they are incapable of parallel read/write of matrix data in rows/columns or read/write across rows, and thus improve read/write efficiency of storage systems and memories.

Technical Solution

The present disclosure provides a multi-granularity parallel storage system including a memory read/write (R/W) port and a memory. The memory R/W port has a bit width of W, W is the nth power of 2, and n is a natural number. The memory includes W memory blocks and a data gating network. Each of the memory blocks is a 2-dimension (2D) array consisting of multiple memory units, and each row of the 2D array includes W memory units. For each memory block, one row can be read/written at a time.

According to the present disclosure, the data gating network selects W memory units for read/write from the W memory blocks based on R/W address and R/W granularity g. The R/W granularity g refers to the number of memory units having consecutive addresses, and $g=2^k$, k is a natural number, $0 \leq k \leq K$, $K=\log_2 W$.

According to the present disclosure, every g adjacent memory blocks are concatenated into one logic Bank, and all the logic Banks have the same start address.

According to the present disclosure, the start addresses of the memory blocks in each logic Bank are consecutive, the addressing range of each logic Bank is 0~gN−1, and the addressing range of the entire memory is 0~gN−1, where N denotes the size of one memory block.

According to the present disclosure, in a read operation, the memory transmits a R/W address and a R/W granularity to each logic Bank. Each logic Bank reads and transfers g memory units to the memory R/W port via the data gating network. Data read by W/g logic Bank are concatenated from left to right into output data of a bit width W.

According to the present disclosure, in a write operation, the memory divides data transferred from the memory R/W port into W/g portions, each portion of data having a bit width of g. The memory transmits the ith portion of data to the ith logic Bank, $0 \leq i \leq W/g$, and simultaneously transmits a R/W address and a R/W granularity to each logic Bank, and each logic Bank writes g memory units.

The present disclosure also provides a multi-granularity parallel memory including W memory blocks and a data gating network, W is the nth power of 2, and n is a natural number. Each of the memory blocks is a 2-dimension (2D) array consisting of multiple memory units, and each row of the 2D array includes W memory units. For each memory block, one row can be read/written at a time.

According to the present disclosure, the data gating network selects W memory units for read/write from the W memory blocks based on R/W address and R/W granularity g. The R/W granularity g refers to the number of memory units having consecutive addresses.

According to the present disclosure, every g adjacent memory blocks are concatenated into one logic Bank, and all the logic Banks have the same start address.

According to the present disclosure, the start addresses of the memory blocks in each logic Bank are consecutive, the addressing range of each logic Bank is 0~gN−1, and the addressing range of the entire memory is 0~gN−1, where N denotes the size of one memory block.

According to the present disclosure, in a read operation, a R/W address and a R/W granularity are transmitted to each logic Bank. Each logic Bank reads and transfers g memory units to the memory R/W port via the data gating network. Data read by W/g logic Bank are concatenated from left to right into output data of a bit width W.

According to the present disclosure, in a write operation, data transferred from the memory R/W port are divided into W/g portions, each portion of data having a bit width of g. The ith portion of data are transmitted to the ith logic Bank, $0 \leq i \leq W/g$, and at the same time a R/W address and a R/W granularity are transmitted to each logic Bank. Each logic Bank writes g memory units.

Technical Effects

The multi-granularity parallel storage system and memory of the present disclosure have a structure of multiple logic Banks, and support a multi-granularity parallel R/W mode and a multi-granularity addressing scheme. They can support parallel read/write of matrix row and column data of different data types at the same time, and thus essentially eliminate the need for a transposition operation in signal processing and improve efficiency of signal processing.

DETAILED DESCRIPTION OF THE EMBODIMENTS

In the following, the present disclosure will be further explained with reference to the figures and specific embodiments so that the objects, solutions and advantages of the present disclosure become more apparent.

To facilitate description of the present disclosure, the bit width of each type of data is measured by using a memory unit as reference. The memory unit is defined as the addressing unit of the memory, that is, the minimal data bit width by which a R/W operation can be performed in the memory. In the description, phrases including "bit width of W" should be construed as bits of W memory units.

If the memory unit is of an 8 bit byte, the actual bit width of the memory having a 4-bit-width R/W port is 4×8=32 bits. Further, all objects are numbered from 0 in a left-to-right manner. The term "granularity" represents the number of memory units having consecutive addresses. Hereafter, symbols are defined as follows:

W: the bit width of the memory R/W port; it must be a power of 2 (i.e., W is the nth power of 2, and n is a natural number);

K: $K=\log_2 W$, and K+1 represents types of R/W granularity supported by the memory;

k: a parameter of memory R/W granularity; it is a natural number, and $0 \leq k \leq K$; an actual R/W granularity is denoted as $g=2^k$;

g: $g=2^k$, denoting the memory R/W granularity, $1 \leq g \leq W$;

N: the size of a memory block.

Although it is assumed in the figures of the present disclosure that W=4, the present disclosure is also applicable when W is some other power of 2.

I. Logic Structure of Storage System and Memory

Figure 3:
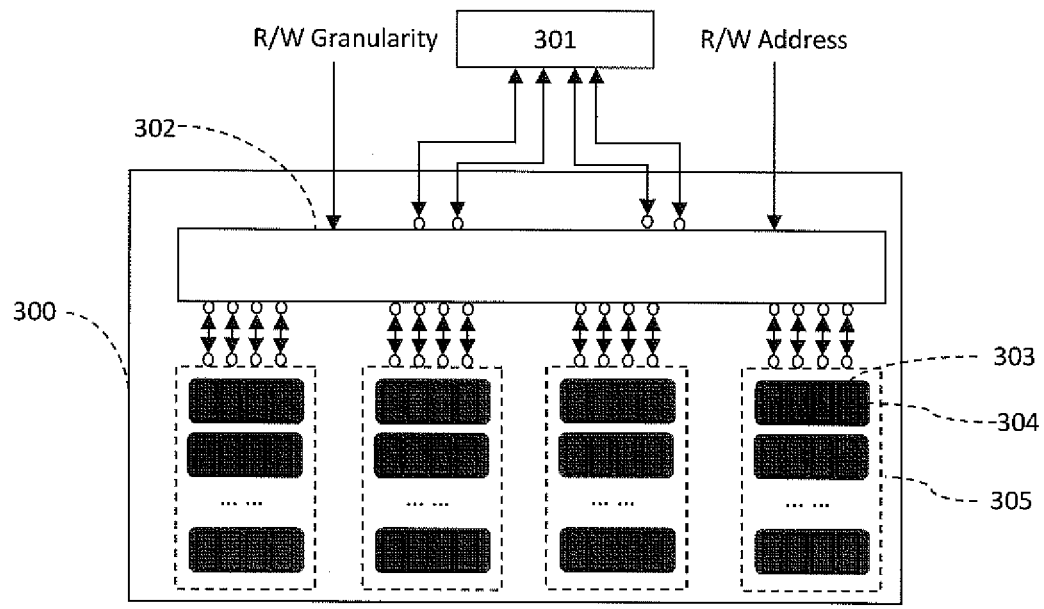
FIG. 3 is a schematic diagram showing a logic structure of a memory in a multi-granularity parallel storage system according to the present disclosure.

FIG. 3 shows the logic structure of a storage system according to the present disclosure. The storage system includes a memory 300, and a memory R/W port 301 having a bit width of W. The memory 300 includes W memory blocks 305, and a data gating network 302. Each of the memory blocks 305 is a 2-dimension (2D) array consisting of memory units 303, and each row 304 of the 2D array must include W memory units 303. For each memory block, one row 304 can be read/written at a time.

To be noted, the memory blocks 305 are intended to illustrate the logic structure, other than the physical structure, of the memory units 303.

The data gating network 302 selects logically, from the W memory blocks 305, W memory units 303 as R/W targets according to the R/W address and the R/W granularity.

Figure 1:
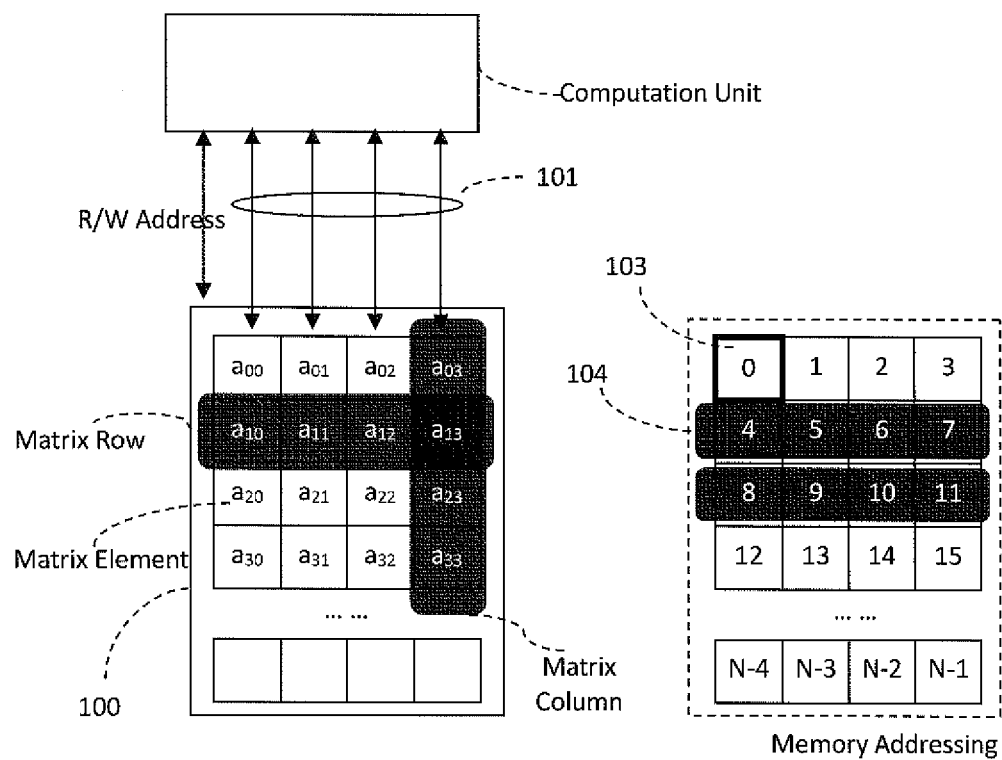
FIG. 1 is a schematic diagram of a structure of a conventional on-chip memory and an addressing scheme thereof, showing the locations of matrix elements on the memory when the data type of the matrix is consistent with memory unit.
Figure 2:
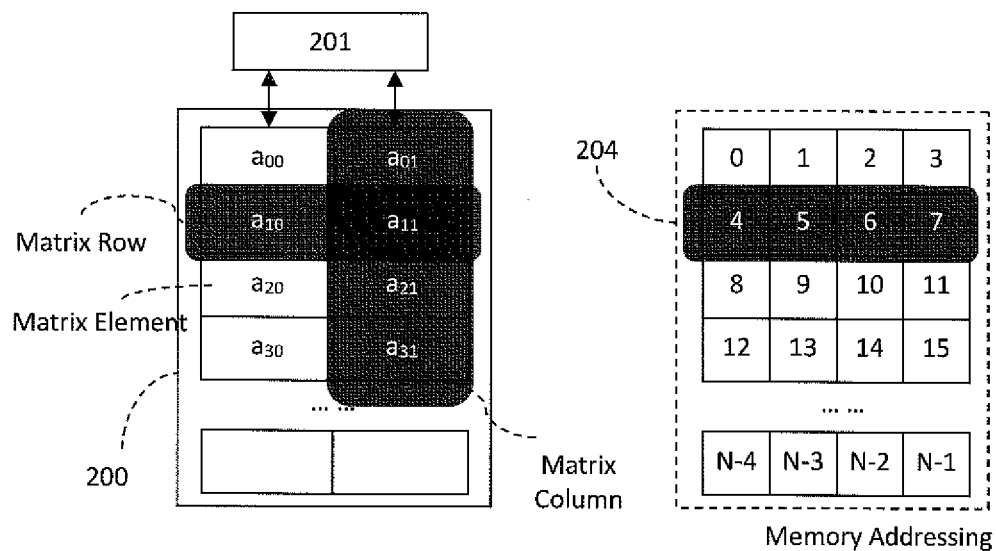
FIG. 2 is another schematic diagram of a structure of a conventional on-chip memory and an addressing scheme thereof, showing the locations of matrix elements on the memory when the bit width of the matrix data is twice larger than that of the memory unit.

The storage system of the present disclosure supports multiple R/W granularities. The addressing scheme for each memory block 305 in the storage system is the same as the memory of FIG. 1. With different R/W granularities, however, the start address of each memory block 305 changes. The parameter k denotes different R/W granularities, and the actual R/W granularity is $g=2^k$.

Figure 4:
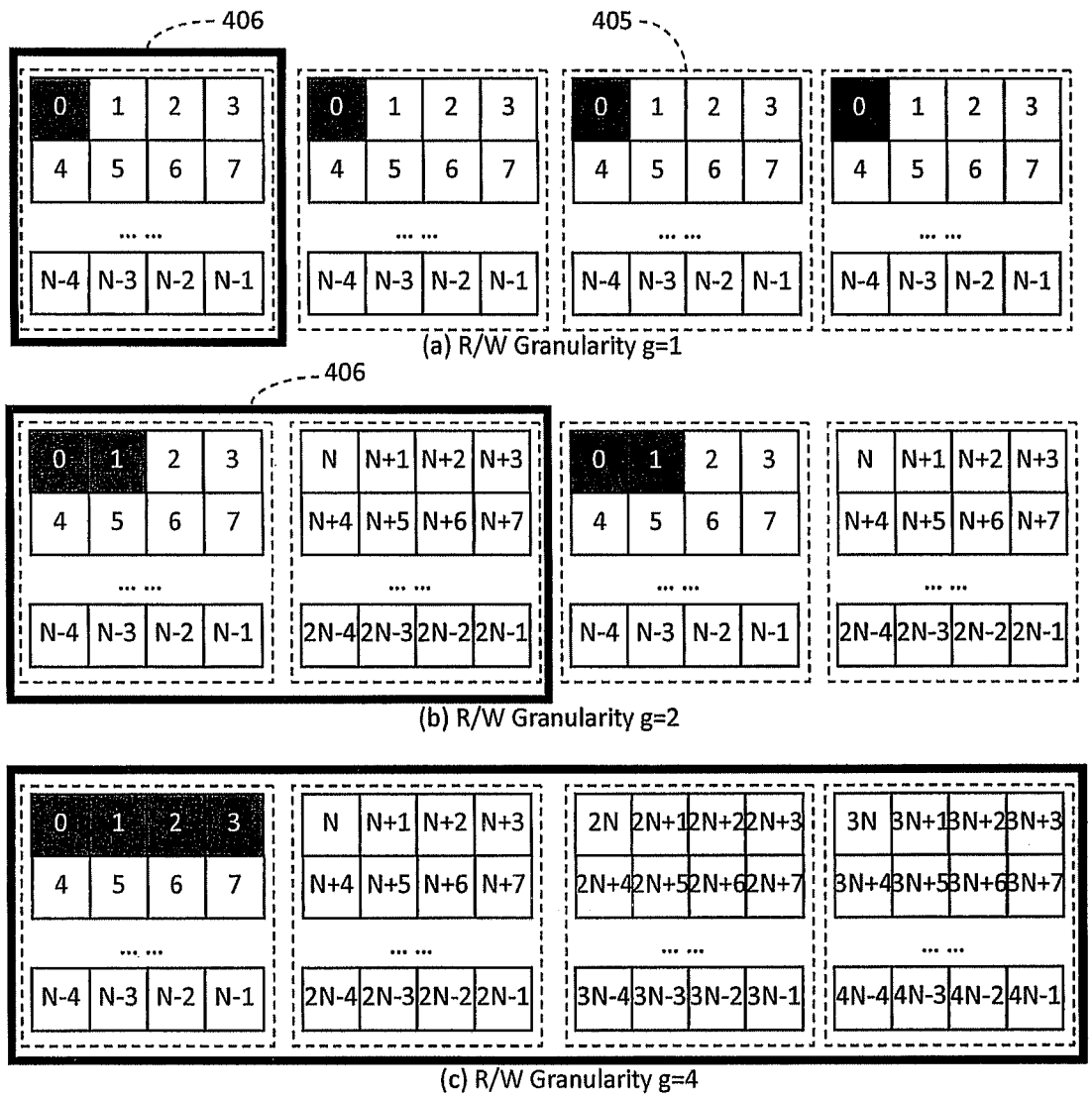
FIG. 4 is a schematic diagram showing addressing schemes and logic Bank divisions of a memory with different R/W granularities in a multi-granularity parallel storage system according to the present disclosure.

FIG. 4 shows the addressing configurations of each memory block 405 of the memory in different R/W granularities when W=4. For the R/W granularity g, each g adjacent memory blocks 405 are concatenated into a logic Bank 406. All the logic Banks 406 have the same start address. The start addresses of the memory blocks in each logic Bank 406 are consecutive. The addressing range of each logic Bank 406 is 0~gN−1, and the addressing range of the entire memory is 0~gN−1.

In a read operation, the memory transmits a R/W address and a R/W granularity to each logic Bank 406. Each logic Bank 406 reads and transfers g memory units to the memory R/W port 301 via the data gating network 302. Data read by W/g logic Banks 406 are concatenated from left to right into output data of a bit width W.

In a write operation, the memory divides data transferred from the memory R/W port 301 into W/g portions, each portion of data having a bit width of g. The memory transmits the ith portion of data to the ith logic Bank 406 ($0 \leq i \leq W/g$), and at the same time transmits a R/W address and a R/W granularity to each logic Bank 406. Each logic Bank 406 writes g memory units.

Figure 5:
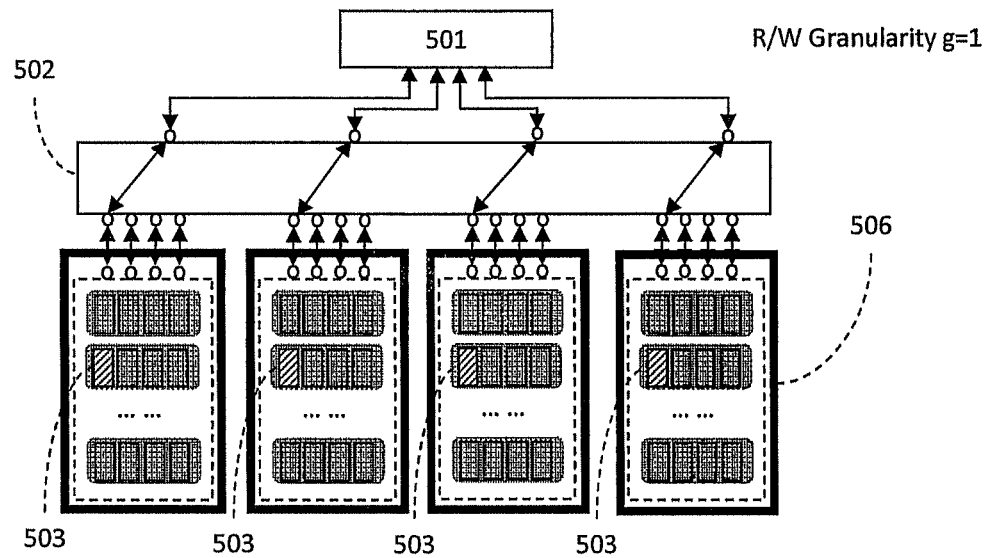
FIG. 5 shows correspondence between R/W data and memory unit in a memory and a data gating path when the R/W granularity g=1, and the R/W address=4.

FIG. 5 shows a logic path inside the memory when the R/W granularity g=1, and the R/W address=4. The data gating network 502 has a gating logic as shown in the figure. Data from the memory R/W port 501 correspond to a respective memory unit 503 having the address of 4 and the granularity of 1 in each of the logic Bank 506.

Figure 6:
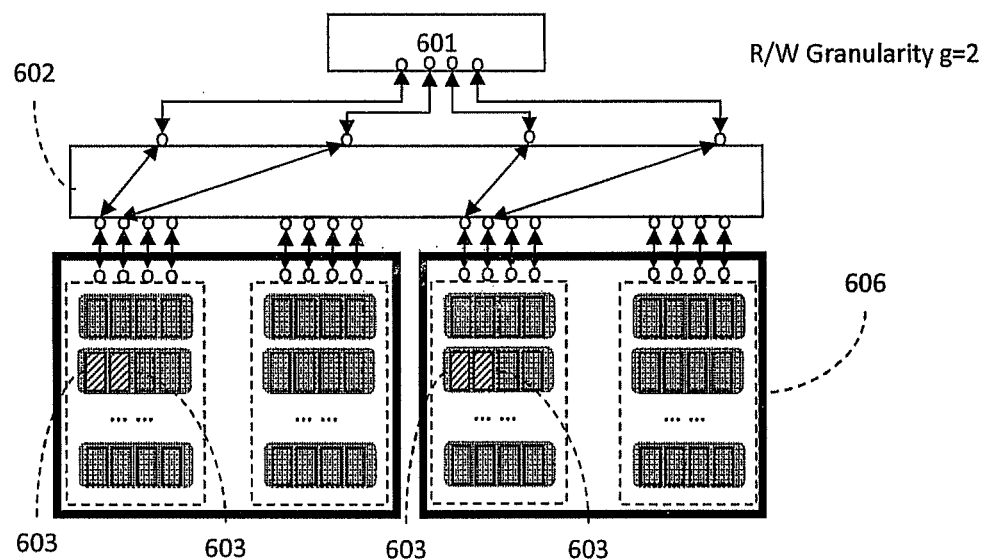
FIG. 6 shows correspondence between R/W data and memory unit in a memory and a data gating path when the R/W granularity g=2, and the R/W address=4.

FIG. 6 shows a logic path inside the memory when the R/W granularity g=2, and the R/W address=4. The data gating network 602 has a gating logic as shown in the figure. Data from the memory R/W port 601 correspond to a respective memory unit 603 having the address of 4 and the granularity of 2 in each of the logic Bank 606.

Figure 7:
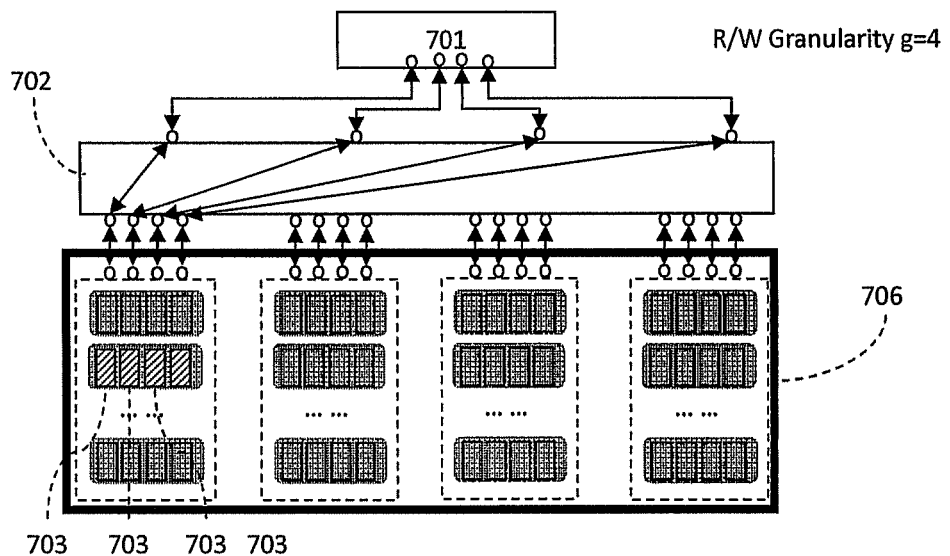
FIG. 7 shows correspondence between R/W data and memory unit in a memory and a data gating path when the R/W granularity g=4, and the R/W address=4.

FIG. 7 shows a logic path inside the memory when the R/W granularity g=4, and the R/W address=4. The data gating network 702 has a gating logic as shown in the figure. Data from the memory R/W port 701 correspond to a respective memory unit 703 having the address of 4 and the granularity of 4 in each of the logic Bank 706.

Matrix elements need to be stored in the memory according to certain rule, to enable parallel read/write of data in rows and columns using the multi-granularity parallel storage system and memory.

Figure 8:
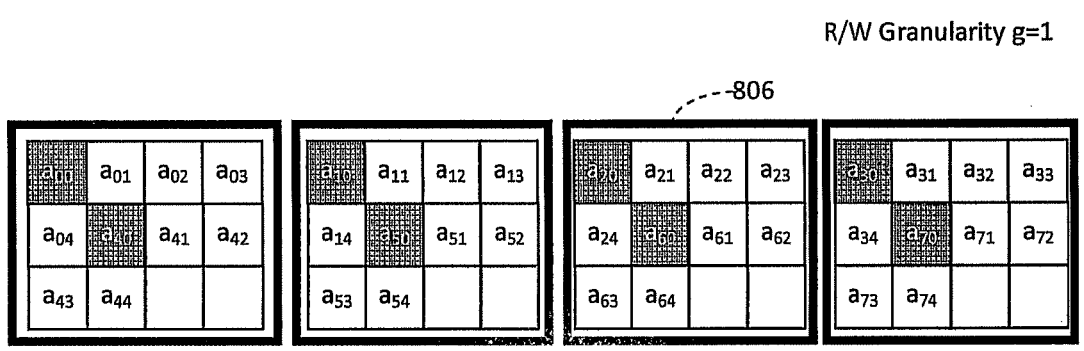
FIG. 8 shows mapping between elements of a 8×5 matrix and memory units when the data bit width of the matrix is equal to the bit width of the memory unit.
Figure 9:
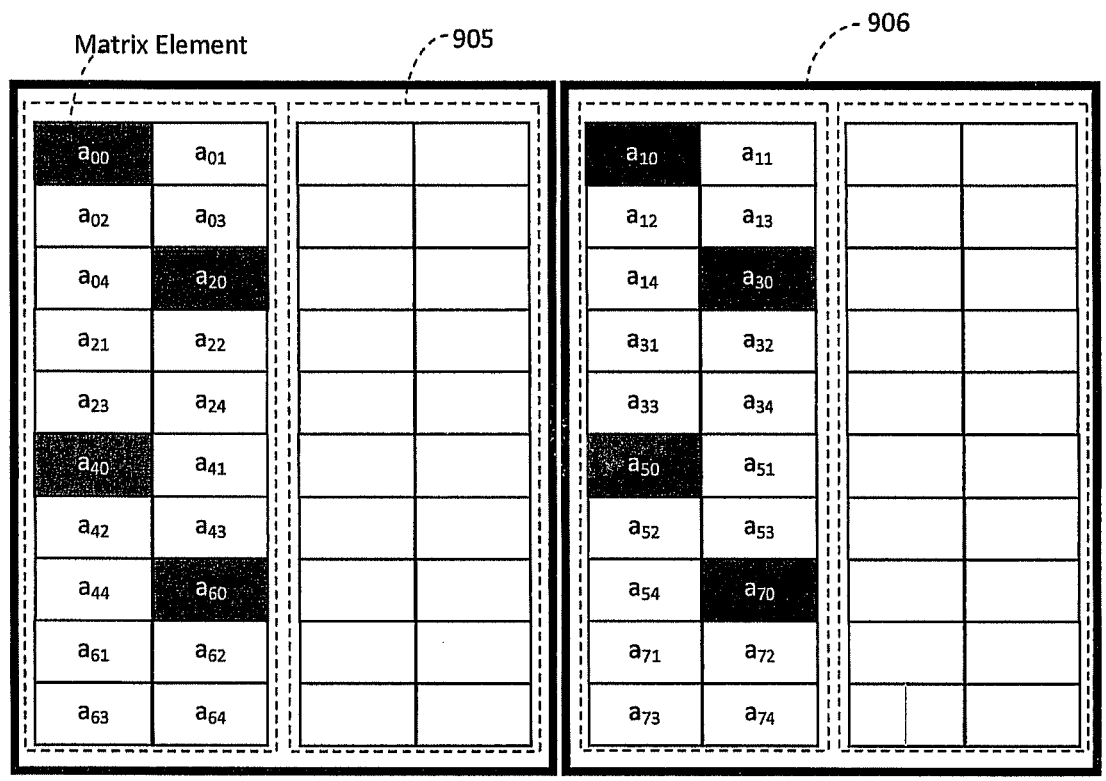
FIG. 9 shows mapping between elements of a 8×5 matrix and memory units when the data bit width of the matrix is twice larger than that of the memory unit.

FIG. 8 shows mapping between matrix elements and memory units when the data bit width of the matrix is equal to the bit width of the memory unit. As shown in FIG. 8, assuming that the matrix is of a size 8×5, and an element at the ith row and the jth column is denoted as $a_{ij}$ ($0 \leq i<8$, $0 \leq j<5$). When the data type of the matrix is the same as the memory unit, logic Banks 806 are configured by the R/W granularity=1, that is, a matrix row of (the index of the row % W==i) is consecutively stored in the ith logic Bank 806. Here, "%" represents modulo operation. In a read/write operation of matrix rows and columns, W consecutive elements in a row or in a column are defined as one data group. For example, $\{a_{00}, a_{01}, a_{02}, a_{03}\}$ denote a data group of elements in a row, and $\{a_{00}, a_{10}, a_{20}, a_{30}\}$ denote a data group of elements in a column. The entire matrix is divided into a plurality of data groups, and the memory can read/write one data group in parallel per clock cycle. Here, the matrix elements are located in the memory as shown in FIG. 8. For parallel read/write of a data group in a row of the matrix, the R/W granularity g=W (here, assuming W=4; W may be any other power of 2), and the R/W address of the jth data group in the ith row is start address of matrix+$N \times (i \% W)+(i/W) \times$the number of matrix columns+$(j \times W)$ Here, "%" represents modulo operation, and "/" represents division operation with no remainder. For parallel read/write of a data group in a column of the matrix, the R/W granularity g=1 as shown in FIG. 8, and the R/W address of the jth data group in the ith column is start address of matrix+$i+(j \times$the number of matrix columns$)$ FIG. 9 shows mapping between elements of the matrix and memory units when the data bit width of the matrix is twice larger than that of the memory unit. As shown in FIG. 9, when the data bit width of the matrix is M (here, assuming M=2; M may be any other power of 2) times larger than that of the memory unit, M memory units are required in order to store one matrix element. Let W'=W/M, and the logic Banks 906 are configured by the R/W granularity g=M, that is, a matrix row of (the index of the row % W'==i) is consecutively stored in the ith logic Bank 906. In a read/write operation of matrix rows and columns, W' consecutive elements in a row or in a column are defined as one data group. For example, $\{a_{00}, a_{01}\}$ denote a data group of elements in a row, and $\{a_{00}, a_{10}\}$ denote a data group of elements in a column. The entire matrix is divided into a plurality of data groups, and the memory can read/write one data group in parallel per clock cycle. Here, the matrix elements are located in the memory as shown in FIG. 9. For parallel read/write of a data group in a row of the matrix, the R/W granularity g=W (here, assuming W=4; W may be any other power of 2), and the R/W address of the jth data group in the ith row is start address of matrix+$N \times M \times (i \% W')+(i/W') \times$the number of matrix columns$\times M+(j \times w)$ Here, "%" represents modulo operation, and "/" represents division operation with no remainder. For parallel read/write of a data group in a column of the matrix, the R/W granularity g=M as shown in FIG. 8, and the R/W address of the jth data group in the ith column is start address of matrix+$i \times M+(j \times$the number of matrix columns$\times M)$ Therefore, by designating different R/W granularities, the storage system and memory of the present disclosure can perform parallel read/write of different types of matrix data in rows and columns.

II. Circuit Arrangement of Storage System

The foregoing describes the overall logic structure of the storage system and memory of the present disclosure, which can be implemented in many specific circuit arrangements. In the following, a specific circuit arrangement of the present disclosure will be described in detail as a physical structure. Any other circuit arrangement will be encompassed in the scope of the present disclosure as long as it can be abstracted into the above logic structure of the present disclosure.

Before the description of the circuit arrangement of the storage system and memory of the present disclosure, explanation will be given about how to map the memory blocks 305 in FIG. 3 into actual physical memory cells. In the illustration, it is assumed again that the memory R/W port has a bit width of 4. However, the bit width of the R/W port may be any other power of 2 in practical applications.

Figure 10:
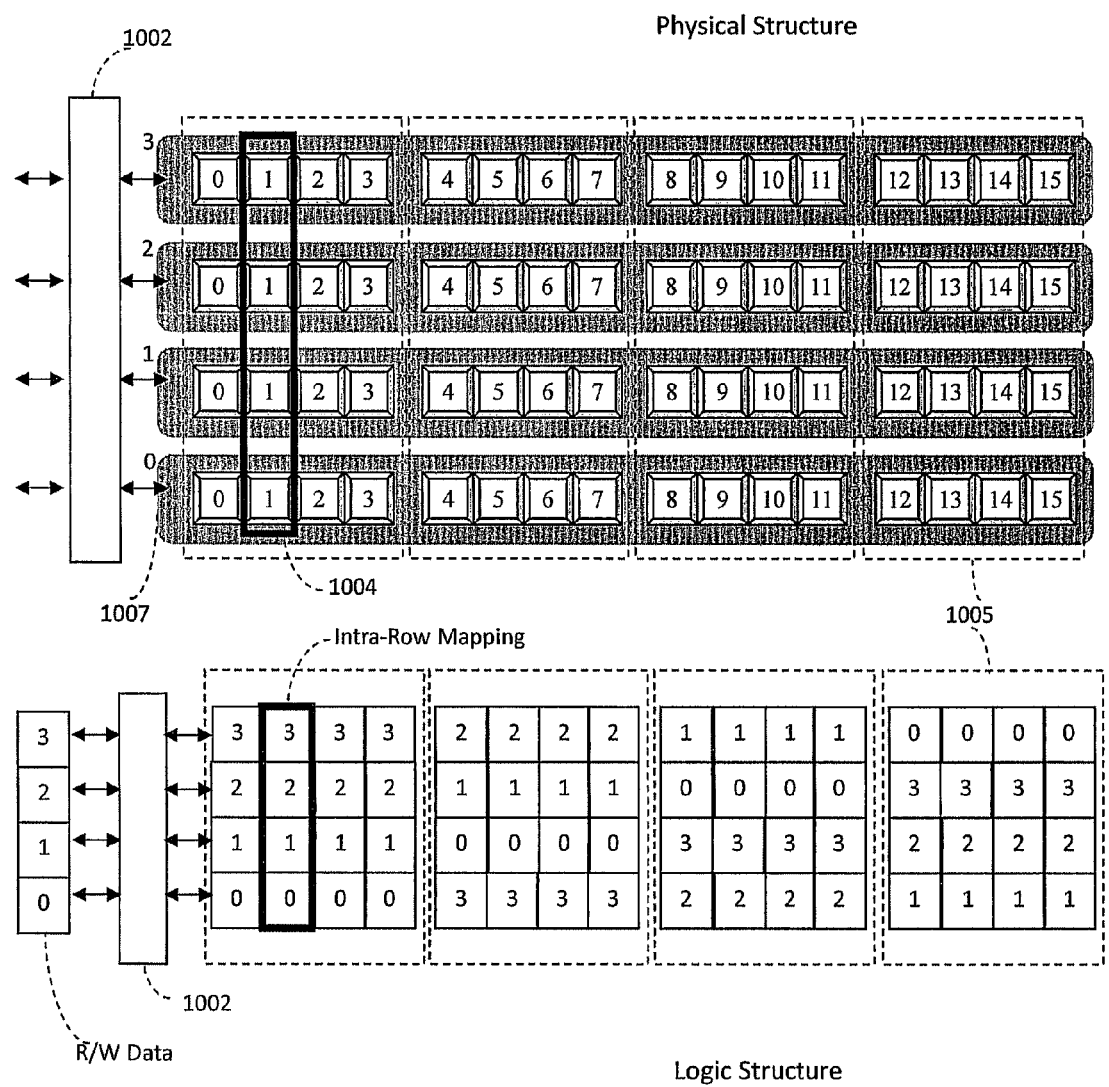
FIG. 10 shows mapping between a memory block 305 and physical memory units.

FIG. 10 shows mapping between the memory blocks 305 and the physical memory cells. For a storage system having a R/W port of bit width W, it may consist of W memories 1007 of byte width 1 in a physical structure. Each of the memories 1007 may be a conventional single-port memory, and only one memory cell can be read/written within a clock cycle. The physical memory cells in the memories 1007 have sequential addresses starting with 0. W physical memory cells having the same address form a memory row 1004 of a logic structure, and a plurality of consecutive memory rows 1004 form a memory block 1005 of the logic structure. The memory block 1005 of size N is formed by N/W memory rows 1004. It is assumed that N=16 in the figure.

To enable the storage system and memory of the present disclosure to perform parallel read/write with different R/W granularities, the circuit arrangement of the present disclosure utilizes a data gating network 1002 to rearrange the read/written data. The logic structure in FIG. 10 shows the sequence of read/written data and intra-row mapping of the physical memory rows. The mapping is the same for the memory rows in each memory block 1001 but changes for different memory blocks 1005. For the ith memory block 1005 (0≤i<W), the mapping is that a one-dimensional (1D) vector formed of W pieces of read/written data, after being cycle-shifted rightward by i elements, correspond to the physical memory cells, respectively, in the physical memory row 1004.

Figure 11:
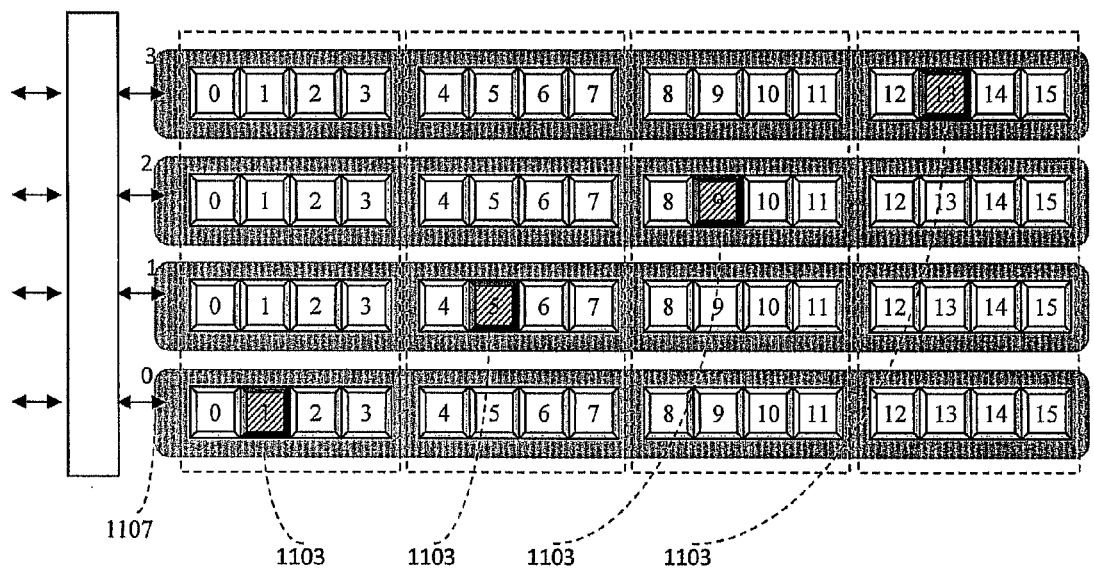
FIG. 11 shows memory units mapped in the mapping of FIG. 10 when the R/W granularity g=1, and the R/W address=4.

With the mapping shown in FIG. 10, FIG. 11 shows corresponding physical memory cells when the R/W granularity g=1, and the R/W address is 4. In this case, the read/written data are stored sequentially in the physical memory cells 1103.

Figure 12:
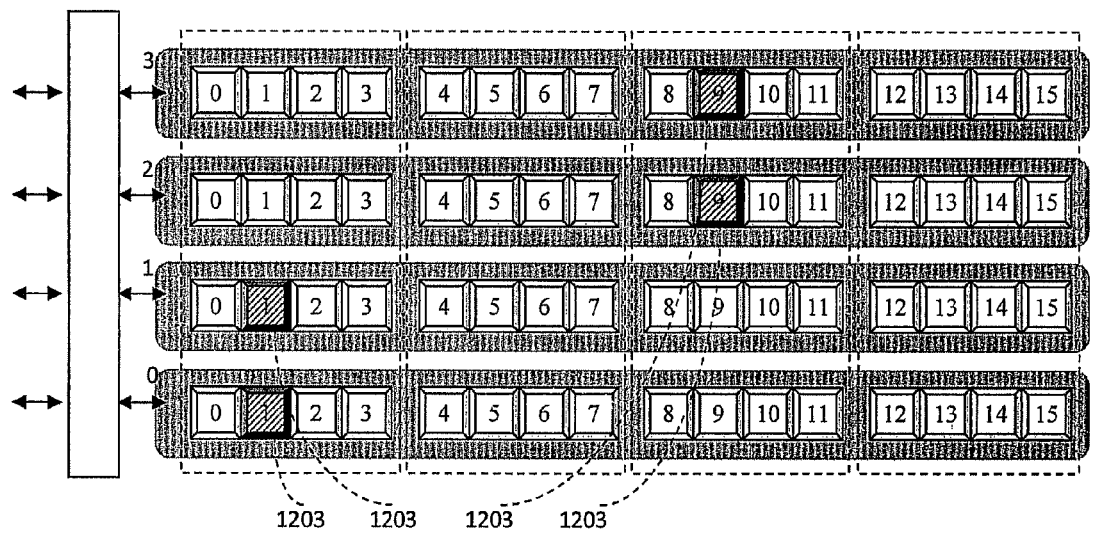
FIG. 12 shows memory units mapped in the mapping of FIG. 10 when the R/W granularity g=2, and the R/W address=4.

With the mapping shown in FIG. 10, FIG. 12 shows corresponding physical memory cells when the R/W granularity g=2, and the R/W address is 4. In this case, the read/written data are stored sequentially in the physical memory cells 1203.

Figure 13:
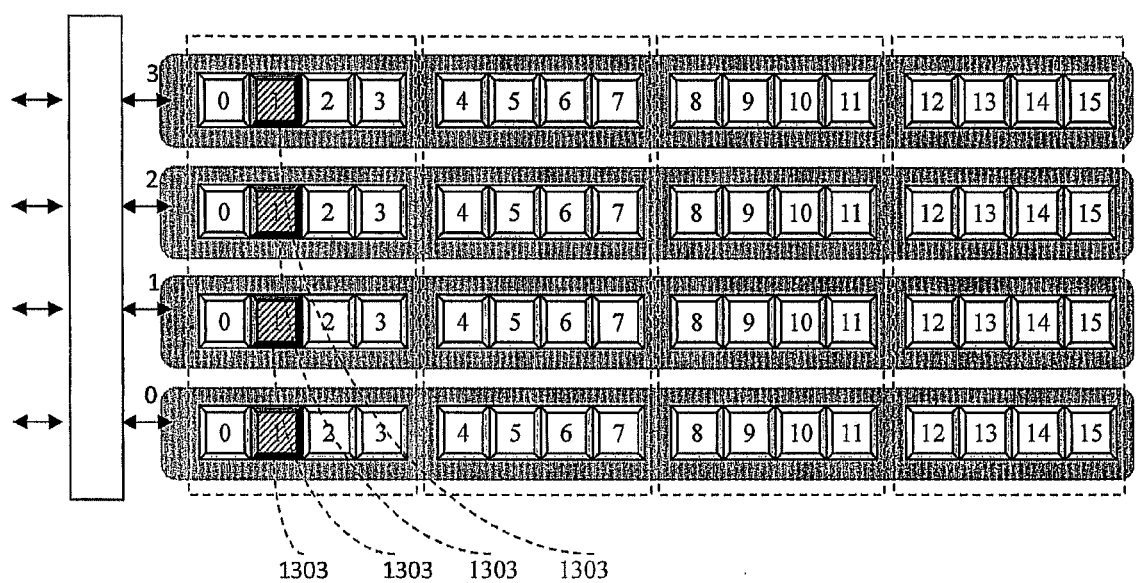
FIG. 13 shows memory units mapped in the mapping of FIG. 10 when the R/W granularity g=4, and the R/W address=4.

With the mapping shown in FIG. 10, FIG. 13 shows corresponding physical memory cells when the R/W granularity g=4, and the R/W address is 4. In this case, the read/written data are stored sequentially in the physical memory cells 1303.

Figure 14:
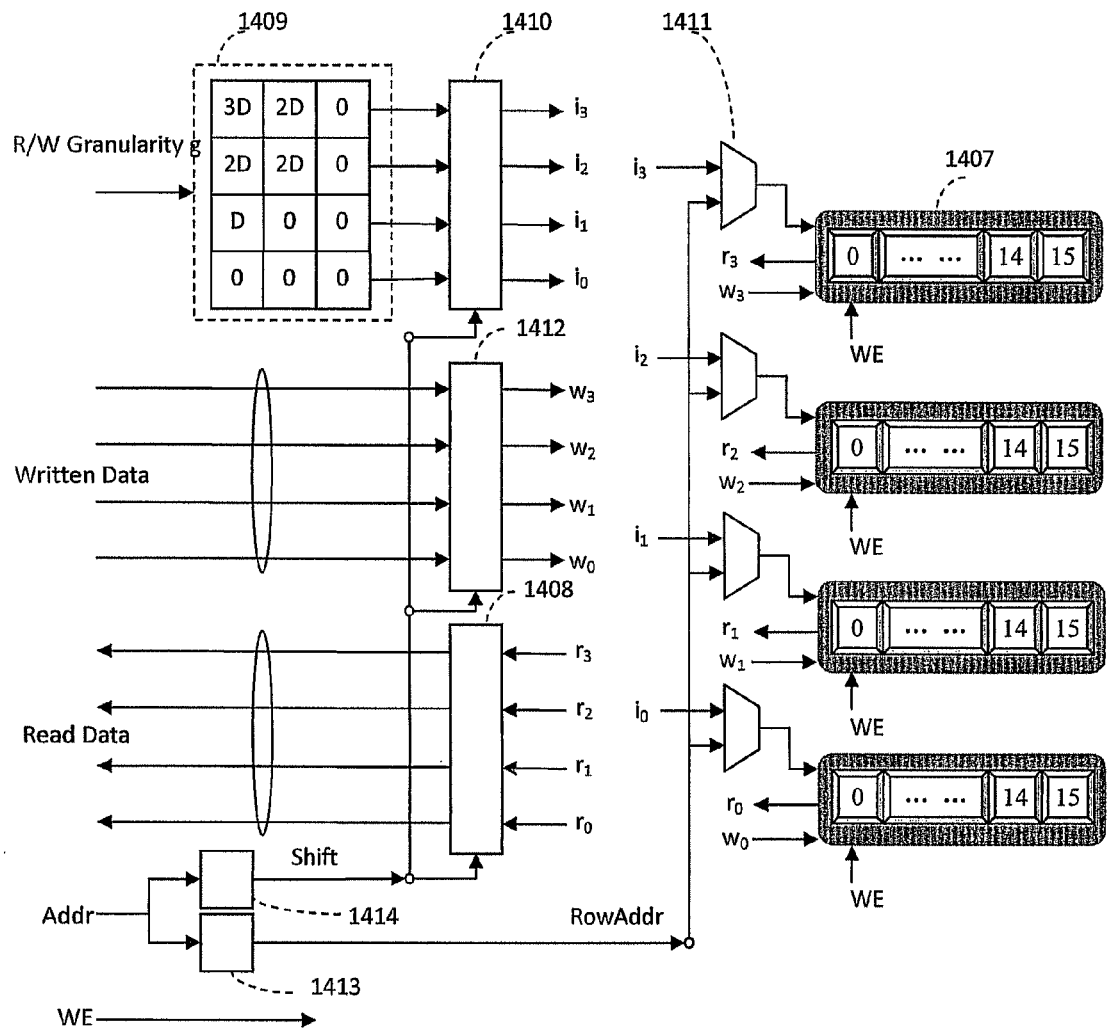
FIG. 14 shows a physical structure of a memory in the mapping of FIG. 10.

With the mapping shown in FIG. 10, FIG. 14 shows the circuit arrangement of the storage system of the present disclosure. In FIG. 14, the storage system includes W memories 1407, a shift generator 1414, a row address generator 1413, an address shifter 1410, a write shifter 1412, a read shifter 1408, W address adders 1411, and an address increment lookup unit 1409.

The external interfaces of the storage system include R/W granularity g, written data, read data, R/W address Addr, and write enable WE.

Each of the W memories 1407 may be a conventional single-port memory having a write enable terminal, a data input terminal, a data output terminal, and an address input terminal. The write enable WE may be directly input to the write enable terminal of each memory 1407.

The shift generator 1414 and the row address generator 1413 each have an input terminal, to which the address Addr is directly input. The shift generator 1414 is configured to generate a shift value Shift based on the current input address Addr, and the row address generator 1413 is configured to generate a row address RowAddr based on the current input address Addr. For the storage system having a byte width of W and memory blocks 305 of size N, Shift=(Addr%W)+(Addr/N), RowAddr=Addr/W. Here, "%" represents modulo operation, and "/" represents division operation with no remainder. When W and N are each a power of 2, the "%" operation may be implemented by truncating less significant bits of data, and the "/" operation may be implemented by truncating the higher-order bits of data.

The address shifter 1410, the write shifter 1412, and the read shifter 1408 each include a shift control terminal. The output terminal of the shift generator 1414 is coupled to the shift control terminals of the address shifter 1410, the write shifter 1412, and the read shifter 1408, respectively, so as to input the shift value Shift to the address shifter 1410, the write shifter 1412, and the read shifter 1408.

The address adders 1411 each have two input terminals and one output terminal. The row address RowAddr generated by the row address generator 1413 is directly input to one of the input terminals of each of the W address adders 1411. The other input terminal of each address adder 1411 receives the data output from the address shifter. The address adder 1411 is configured to perform non-sign addition of data input via its two input terminals to obtain a memory location in the memory 1407. The W address adders 1411 have their output terminals coupled to the address input terminals of the W memories 1407, respectively, to send a R/W address to the address input terminal of each memory 1407.

The address increment lookup unit 1409 has one input terminal and W output terminals. The R/W granularity g is directly input to the input terminal of the address increment lookup unit 1409, whose W output terminals are directly coupled to the input terminal of the address shifter 1410. The address increment lookup unit 1409 generates inputs to the respective address adders 1410 based on the R/W granularity g. There are in total K+1 R/W granularities for a storage system of bit width $W=2^K$. Each column in the address increment lookup unit 1409 corresponds to one R/W granularity. If the memory block 305 in the storage system is of a size N, and D=N/W, the value for the jth (0≤j<W from top to bottom) element in the ith (0≤i<K from left to right) column of the address increment lookup unit 1409 is $[(j/2^i) \times 2^i] \times D$, where "/" represents division operation with no remainder.

The address shifter 1410 is configured to cycle-shift the input data rightward by Shift elements. The address shifter 1410 have W pieces of output data ($i_0$, $i_1$, $i_2$, $i_3$), each piece being sent to one of the input terminals of one of the W address adders 1411.

The write shifter 1412 has its input terminals receive directly written data from the external, and is configured to cycle-shift the input written data rightward by Shift elements. The W pieces of output data ($w_0$, $w_1$, $w_2$, $w_3$) from the write shifter 1412 are sent to the data input terminals of the W memories 1407, respectively.

The read shifter 1408 has W input terminals coupled to the data output terminals of the W memories 1407, respectively, to receive W pieces of input data ($r_0$, $r_1$, $r_2$, $r_3$) from the W memories 1407. The read shifter 1408 is configured to cycle-shift the input data leftward by Shift elements, and output read data via its output terminals.

The leftward or rightward cycle-shift function of the address shifter 1410, the write shifter 1412 and the read shifter 1408 may be implemented, for example, by a multiplexer, or other appropriate functional devices.

The foregoing description of the embodiments illustrates the objects, solutions and advantages of the present disclosure. It will be appreciated that the foregoing description refers to specific embodiments of the present disclosure, and should not be construed as limiting the present disclosure. Any changes, substitutions, modifications and the like within the spirit and principle of the present disclosure shall fall into the scope of the present disclosure.

What is claimed is:

1. A multi-granularity parallel storage system comprising:
a memory R/W port having a bit width of W, W is the nth power of 2, and n is a natural number; and
a memory comprising:
W memory, each is a 2-dimension (2D) array consisting of multiple memory units and each memory row of a 2D array comprises W memory units, for each memory block, one memory row is read/written at a time and a data gating network is configured to select W memory units, as read/write targets, from the W memory blocks based on a R/W address and a R/W granularity g, wherein the R/W granularity g represents a number of memory units having consecutive addresses, and $g=2^k$, k is a natural number, 0≤k≤K, $K=\log_2 W$.

2. The storage system of claim 1, wherein every g adjacent memory blocks are concatenated into one logic Bank, and all logic Banks have a same start address.

3. The storage system of claim 2, wherein start addresses of memory blocks in each logic Bank are consecutive, addressing range of each logic Bank is 0–(gN–1), and addressing range of the entire memory is 0–(gN–1), where N denotes size of one memory block.

4. The storage system of claim 3, wherein in a read operation, the memory is configured to transmit a R/W address and a R/W granularity to each logic Bank, each logic Bank being configured to read and transfer g memory units to the memory R/W port via the data gating network, and wherein data read by W/g logic Banks are concatenated from left to right into output data of a bit width W.

5. The storage system of claim 3, wherein in a write operation, the memory is configured to divide data transferred from the memory R/W port into W/g portions, each portion of data having a bit width of g; and the memory is further configured to transmit the ith portion of data to the ith logic Bank, 0≤i<W/g, via the data gating network, and simultaneously transmit a R/W address and a R/W granularity to each logic Bank, wherein each logic Bank is configured to write g memory units.

6. A multi-granularity parallel memory comprising:
W memory blocks, W is the nth power of 2, n is a natural number, each of the memory blocks is a 2-dimension (2D) array consisting of multiple memory units, and each memory row of a 2D array comprises W memory units, for each memory block, one memory row can be read/written at a time;
a data gating network configured to select W memory units, as read/write targets, from the W memory blocks based on a R/W address and a R/W granularity g, wherein the R/W granularity g represents a number of memory units having consecutive addresses, and $g=2^k$, k is a natural number, 0≤k≤K, $K=\log_2 W$.

7. The memory of claim 6, wherein every g adjacent memory blocks are concatenated into one logic Bank, and all logic Banks have a same start address.

8. The memory of claim 7, wherein start addresses of memory blocks in each logic Bank are consecutive, addressing range of each logic Bank is 0–(gN–1), and the addressing range of the entire memory is 0–(gN–1), where N denotes size of one memory block.

9. The memory of claim 8, wherein in a read operation, a R/W address and a R/W granularity are transmitted to each logic Bank, each logic Bank is configured to read and transfer g memory units to the memory R/W port via the data gating network; and data read by W/g logic Banks are concatenated from left to right into output data of a bit width W.

10. The memory of claim 8, wherein in a write operation, data transferred from a memory R/W port are divided into W/g portions, each portion of data having a bit width of g; the ith portion of data are transmitted to the ith logic Bank, 0≤i<W/g, via the data gating network, and simultaneously a R/W address and a R/W granularity are transmitted to each logic Bank; and each logic Bank writes g memory units.

* * * * *